(12) United States Patent
England et al.

(10) Patent No.: US 7,919,410 B2
(45) Date of Patent: Apr. 5, 2011

(54) PACKAGING METHODS FOR IMAGER DEVICES

(75) Inventors: Luke England, Boise, ID (US); Larry Kinsman, Kuna, ID (US)

(73) Assignee: Aptina Imaging Corporation, George Town (KY)

( * ) Notice: Subject to any disclaimer, the term of this patent is extended or adjusted under 35 U.S.C. 154(b) by 207 days.

(21) Appl. No.: 11/685,808

(22) Filed: Mar. 14, 2007

(65) Prior Publication Data

US 2008/0224192 A1    Sep. 18, 2008

(51) Int. Cl.
*H01L 31/0232*   (2006.01)
*H01L 21/44*    (2006.01)

(52) U.S. Cl. .......... 438/667; 438/65; 257/294; 257/621; 257/680; 257/E31.127

(58) Field of Classification Search ............... 257/621, 257/294, 680, E31.127; 438/667, 65
See application file for complete search history.

(56) References Cited

U.S. PATENT DOCUMENTS

| | | | |
|---|---|---|---|
| 2004/0137701 A1* | 7/2004 | Takao | 438/461 |
| 2004/0188819 A1 | 9/2004 | Farnworth et al. | |
| 2005/0116138 A1* | 6/2005 | Hanada et al. | 250/206 |
| 2005/0181540 A1 | 8/2005 | Farnworth et al. | |
| 2005/0285154 A1* | 12/2005 | Akram et al. | 257/234 |
| 2005/0287783 A1 | 12/2005 | Kirby et al. | |
| 2007/0045780 A1 | 3/2007 | Akram et al. | |

FOREIGN PATENT DOCUMENTS

| | | |
|---|---|---|
| CN | 1601752 A | 3/2005 |
| EP | 0 363 256 A1 | 4/1990 |
| EP | 1 408 547 A2 | 4/2004 |
| EP | 1408547 A2 | 4/2004 |

OTHER PUBLICATIONS

Masahiro Sekiguchi, Hideo Numata, Ninao Sato, Tatsuhiko Shirakawa, Mie Matsuo, Hiroshi Yoshikawa, Mitsuhiko Yanagida, Hideo Nakayoshi, Kenji Takahashi; Novel low cost integration of through chip interconnection and application to cmos image sensor; IEEE: Electronic Components and Technology Conference (ECTC), Jul. 5, 2006; p. 1367-1374.*

Masahiro Sekiguchi et al.; Novel low cost integration of through chip interconnection and application to cmos image sensor; 2006 Electronic Components and Technology Conference; Jul. 5, 2006; p. 1367-1374.*

(Continued)

*Primary Examiner* — N Drew Richards
*Assistant Examiner* — John P Dulka

(57) ABSTRACT

An imager device is disclosed which includes at least one photosensitive element positioned on a front surface of a substrate and a conductive structure extending at least partially through an opening defined in the substrate to conductively couple to an electrical contact or bond pad on the front surface. An insulating material of a conductive laminate film and/or a mold compound material is positioned within the opening between at least a portion of the conductive structure and the substrate. Also disclosed is a device that comprises a substrate and a plurality of openings in the substrate, wherein each of the openings is adapted to be positioned above an imager device when the substrate is positioned above and secured to an imager substrate. A method of forming an imager device is also disclosed.

8 Claims, 21 Drawing Sheets

OTHER PUBLICATIONS

International Search Report and Written Opinion, Feb. 6, 2009.
Leib and Seidemann, "Opto-WLP Technology," *Advanced Packaging*, pp. 28, 30, May/Jun. 2006.
Ostmann et al., "Stackable Packages with Integrated Components," *2003 Electronics Packaging Technology Conference*, pp. 19-23, Jun. 2003.
Sekiguchi et al., "Novel Low Cost Integration of Through Chip Interconnection and Application to CMOS Image Sensor," *2006 Electronic Components and Technology Conference*, pp. 1367-1374, Jun. 2006.
Wu and Poo, "Fabrication of Tapered Through-Vias on (100) Silicon for Wafer Level Packaging," undated.

* cited by examiner

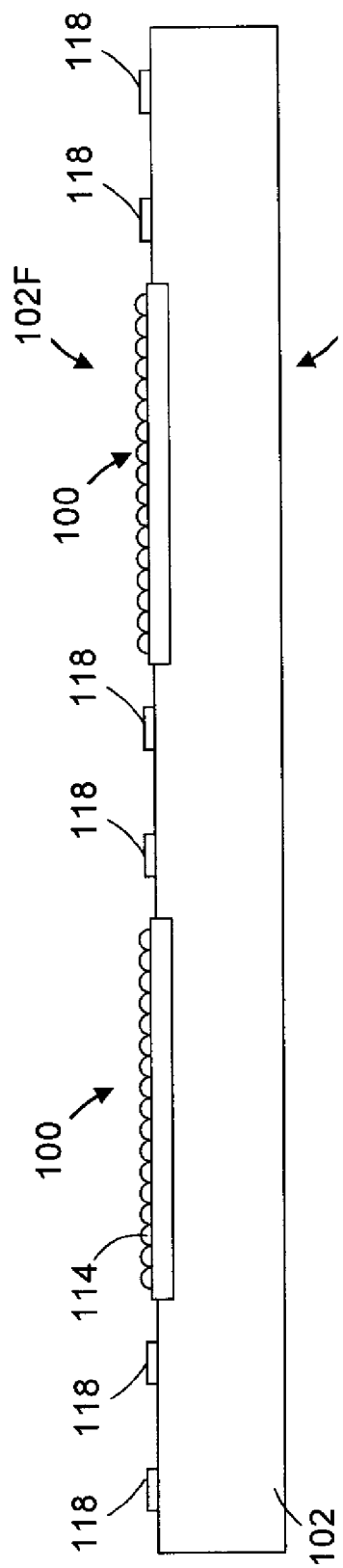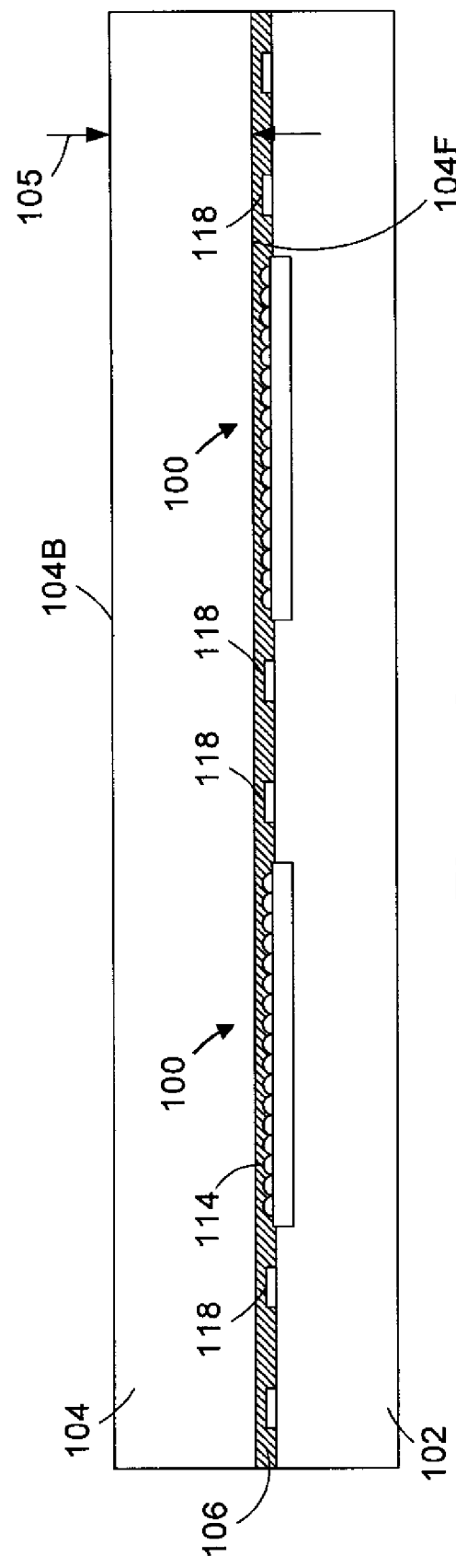

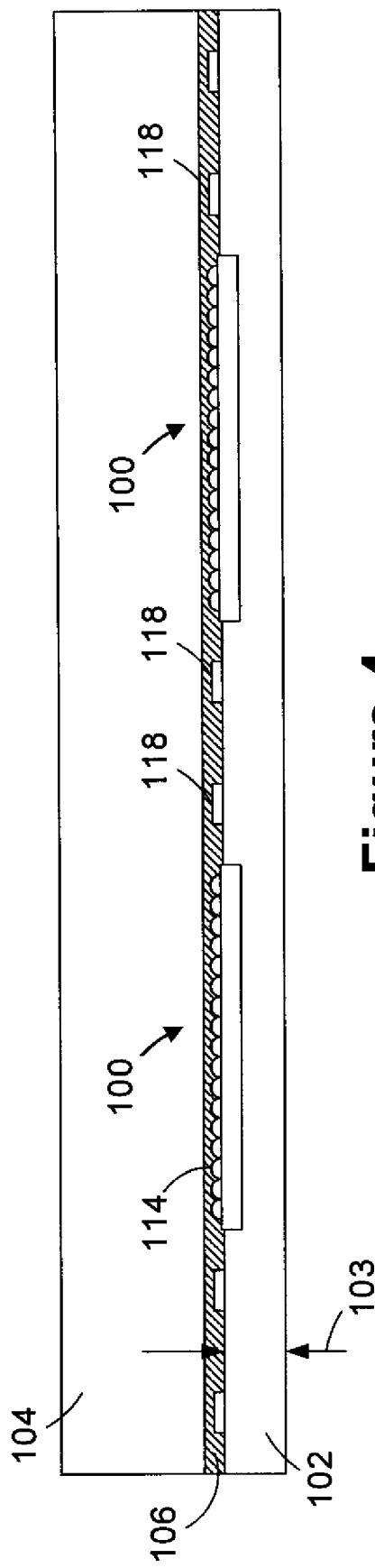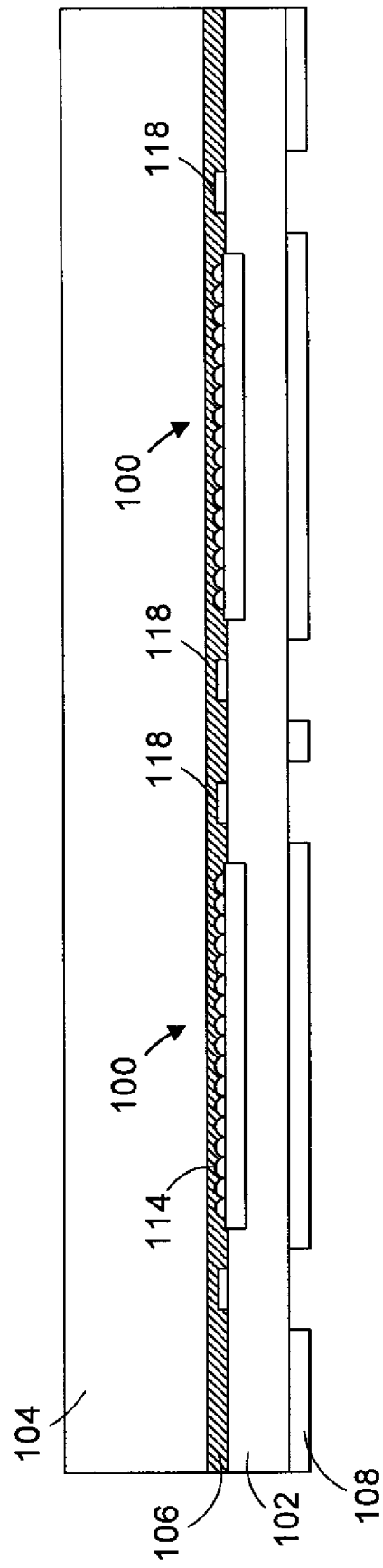

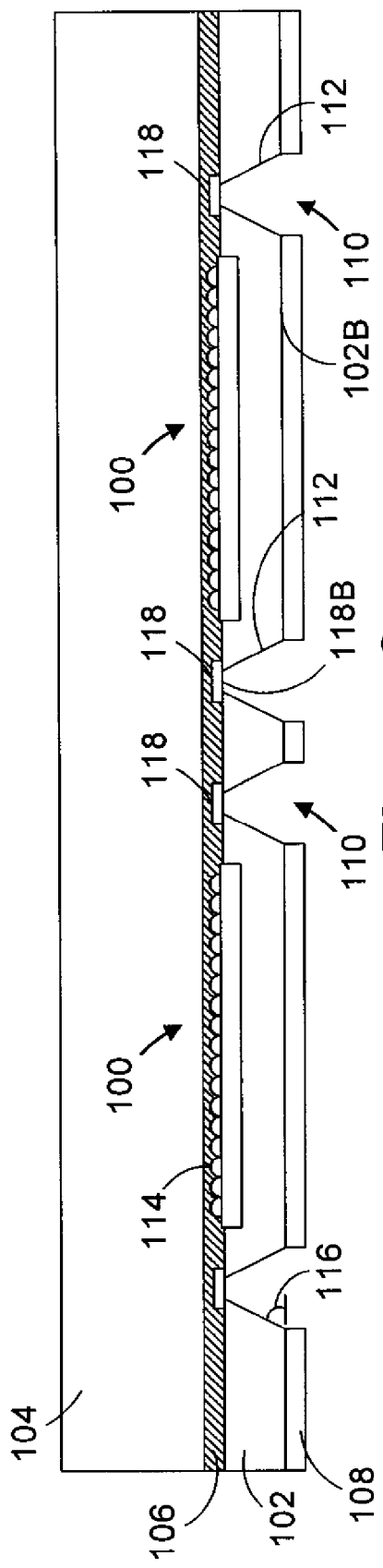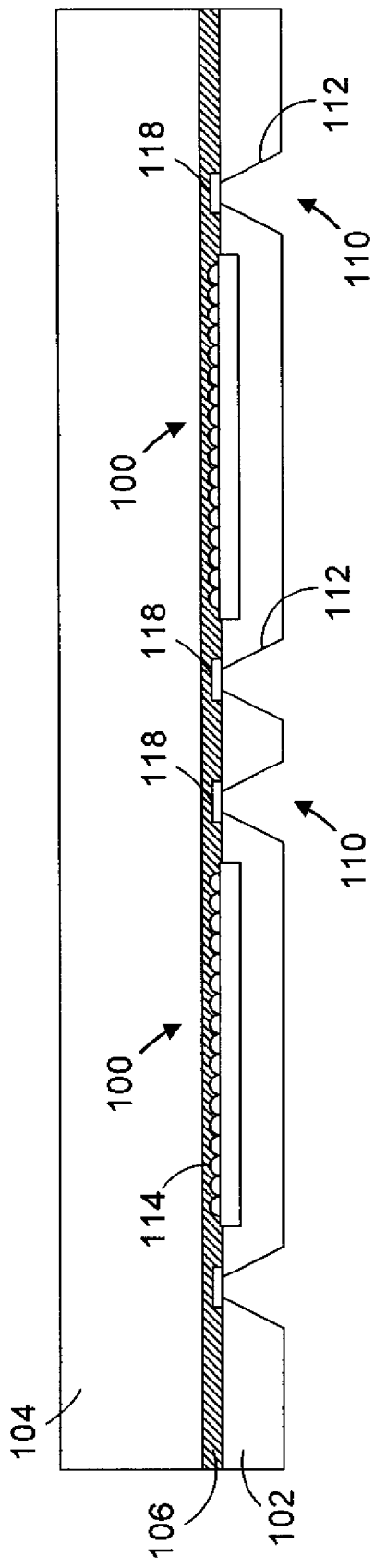

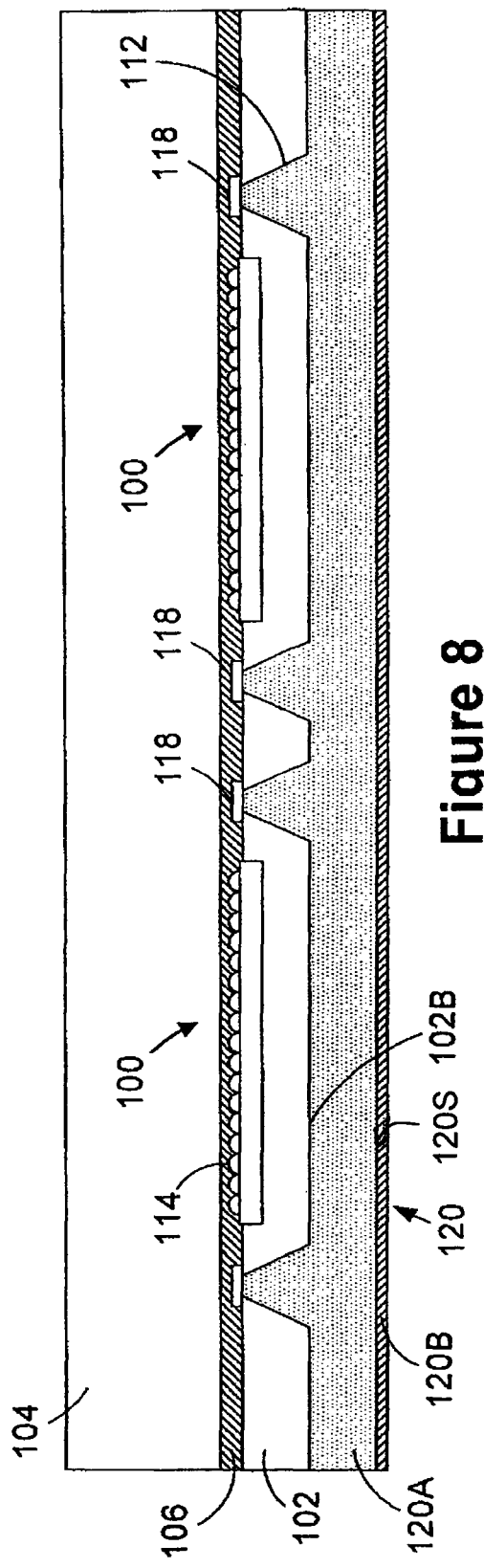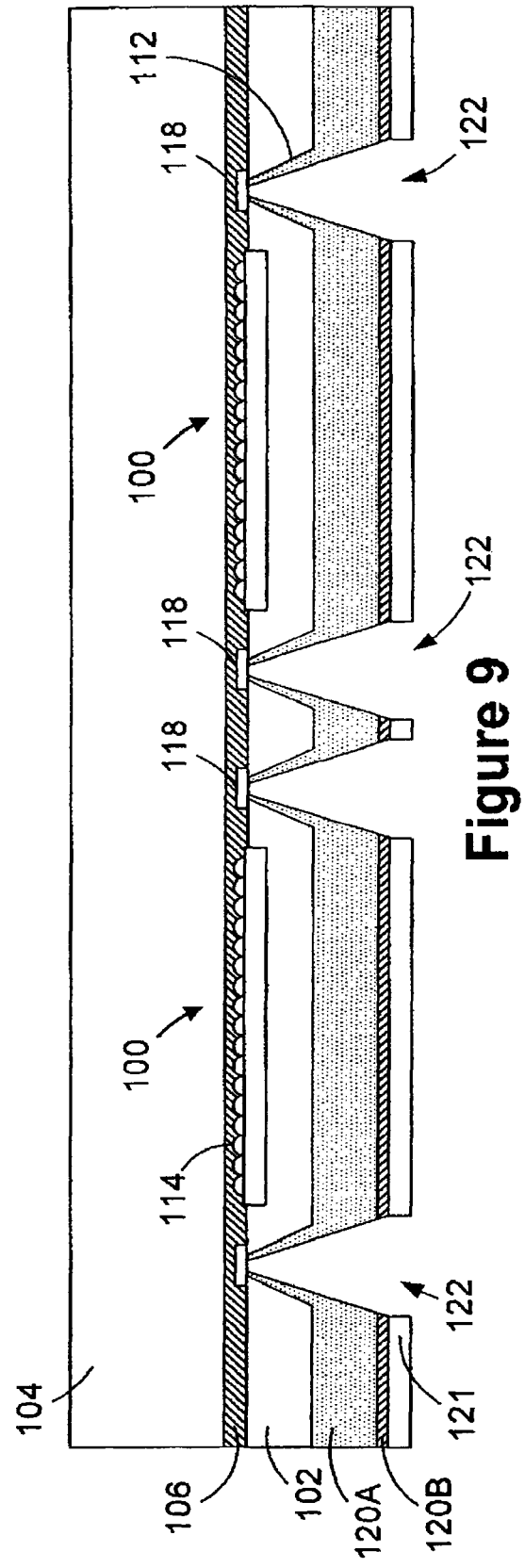

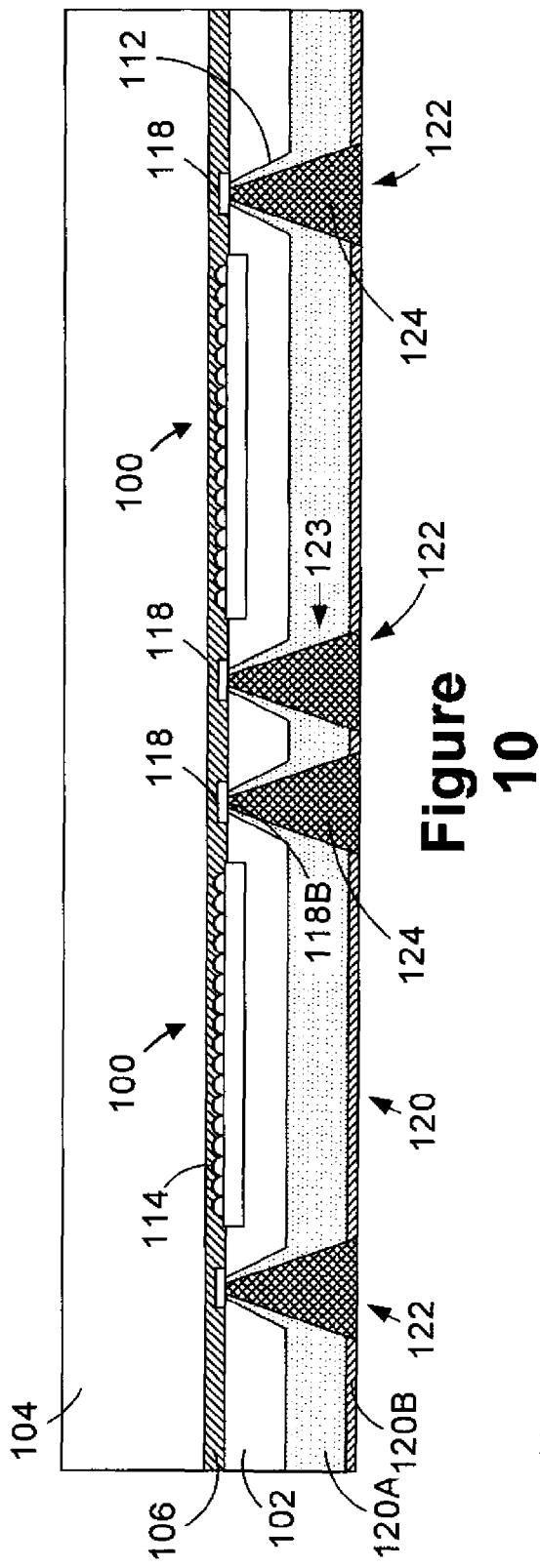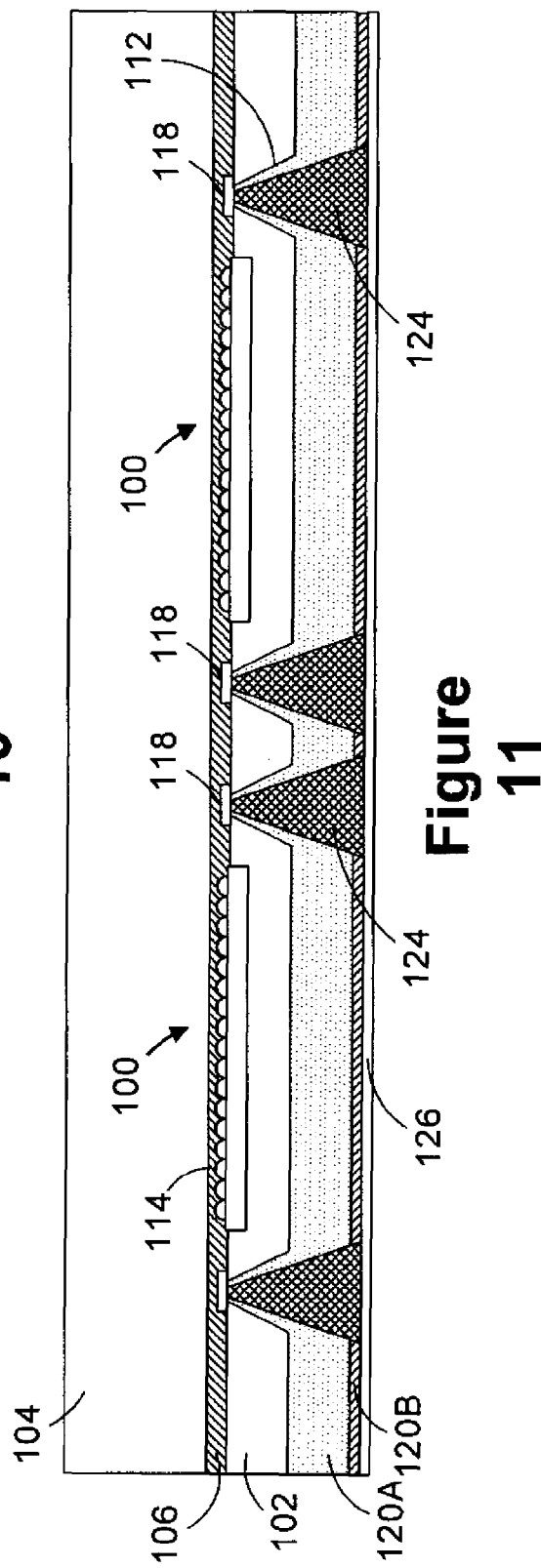

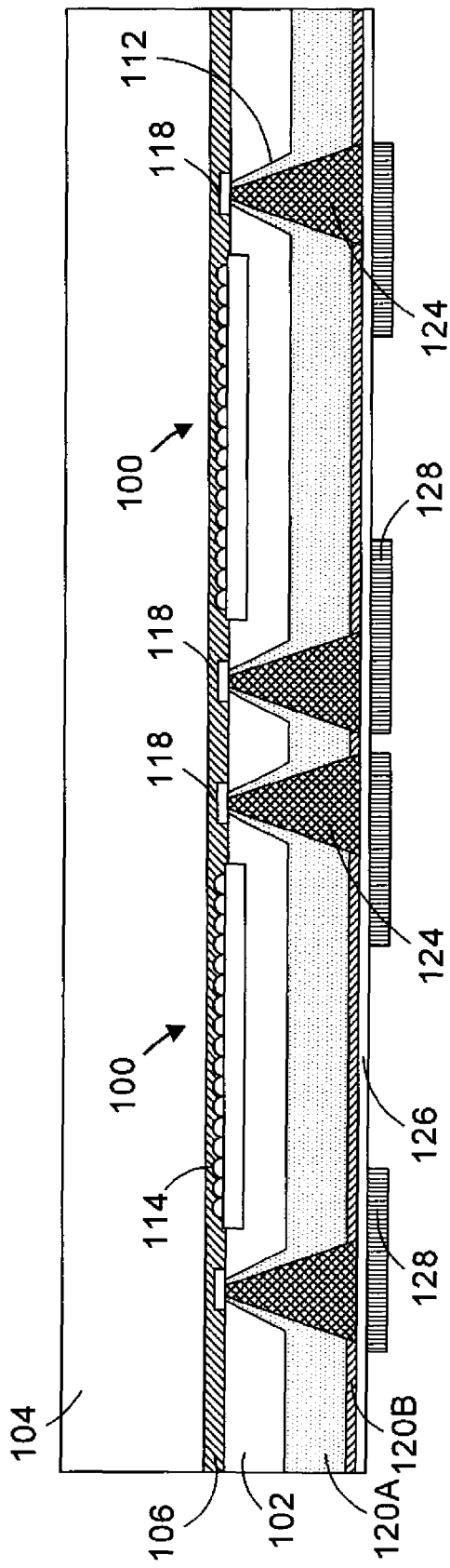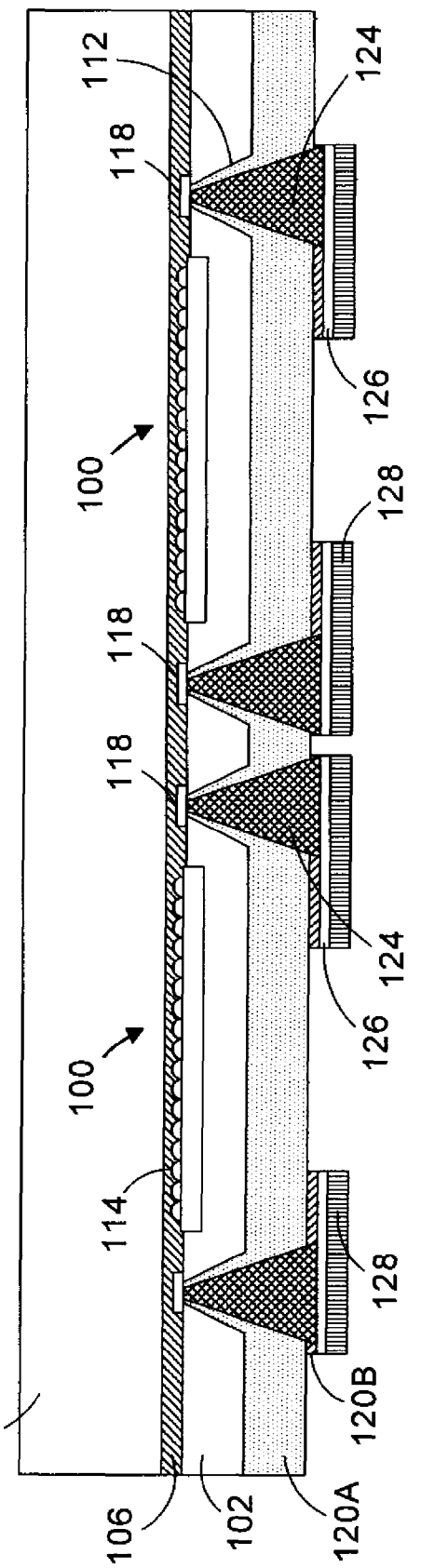

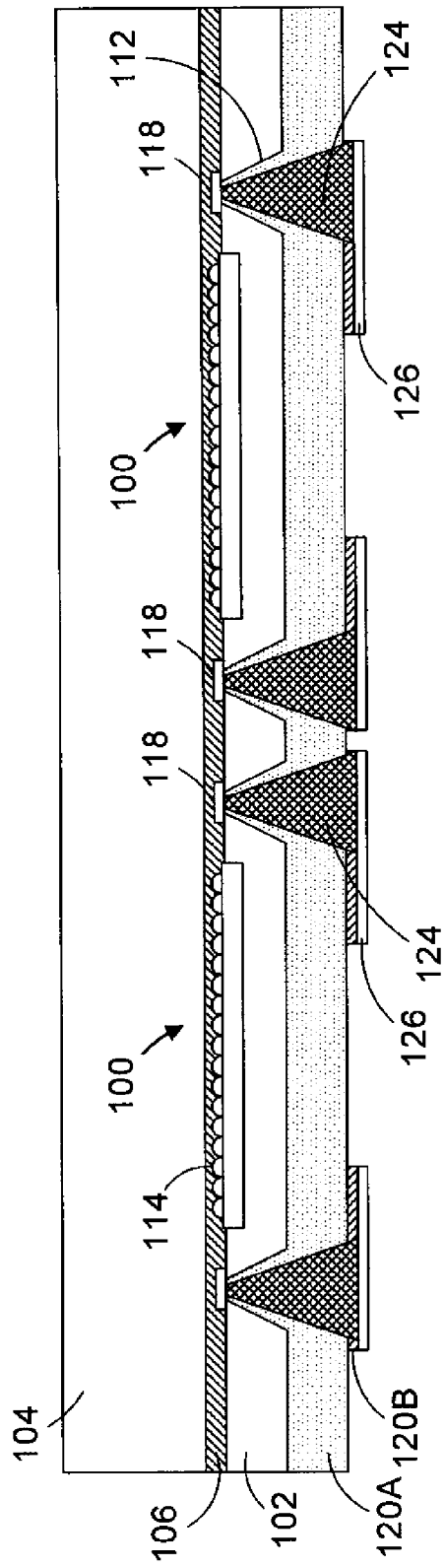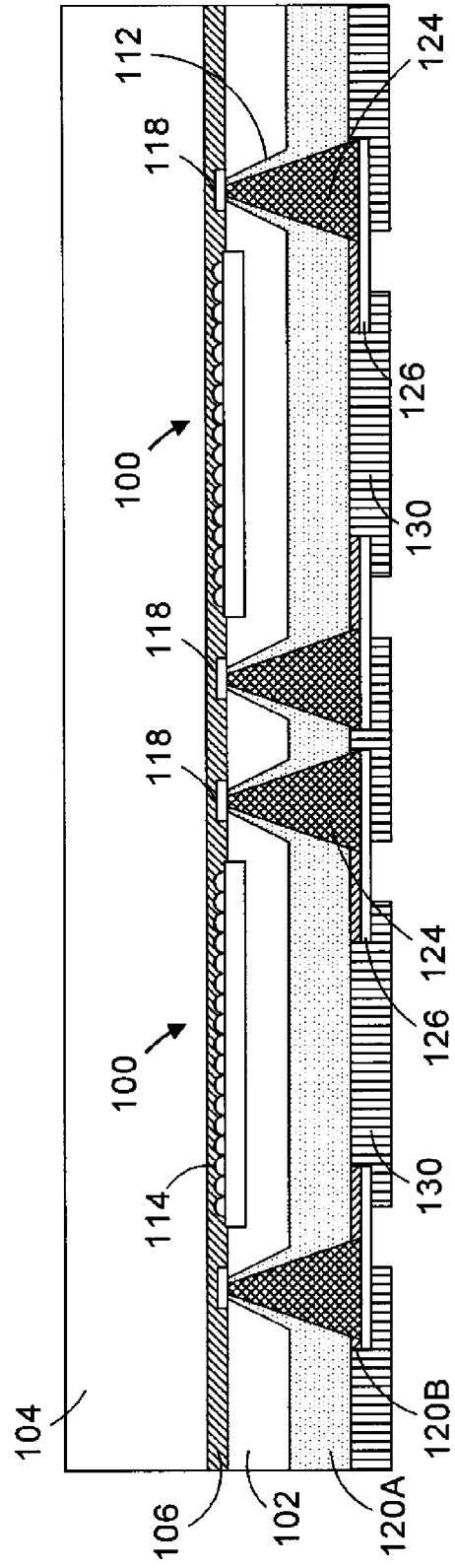

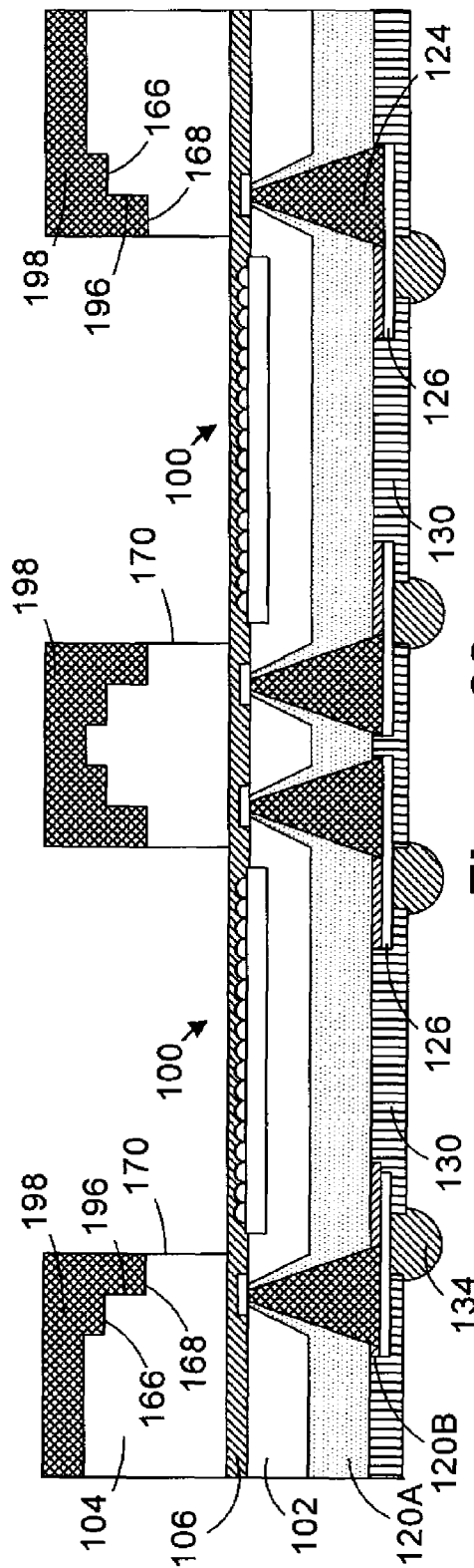
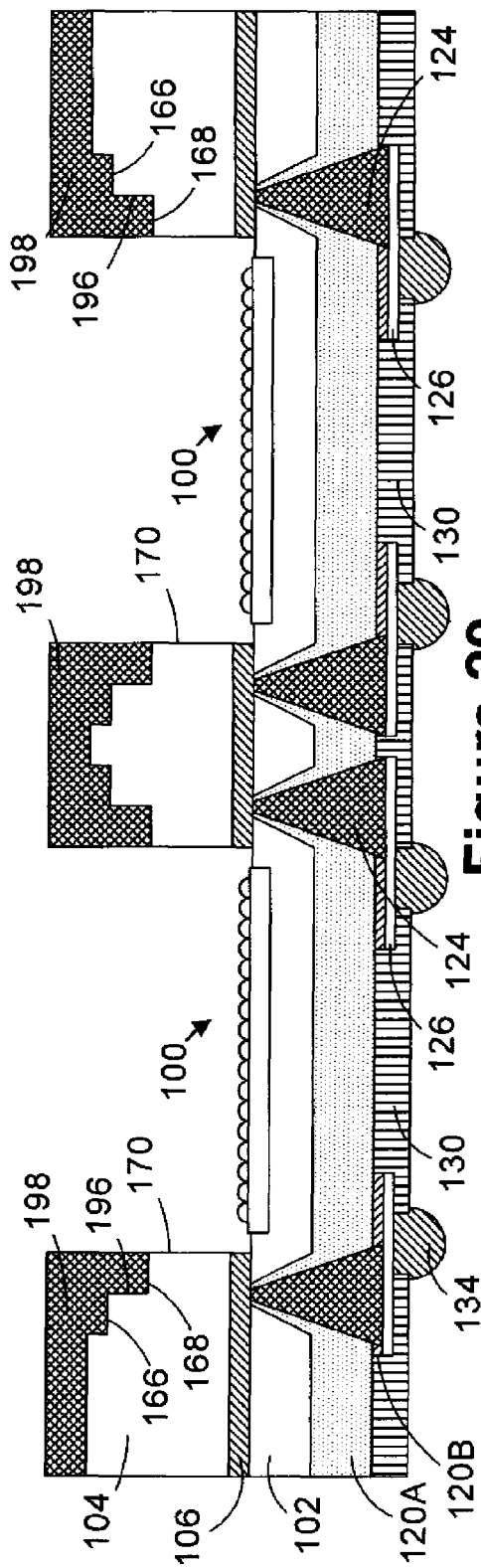

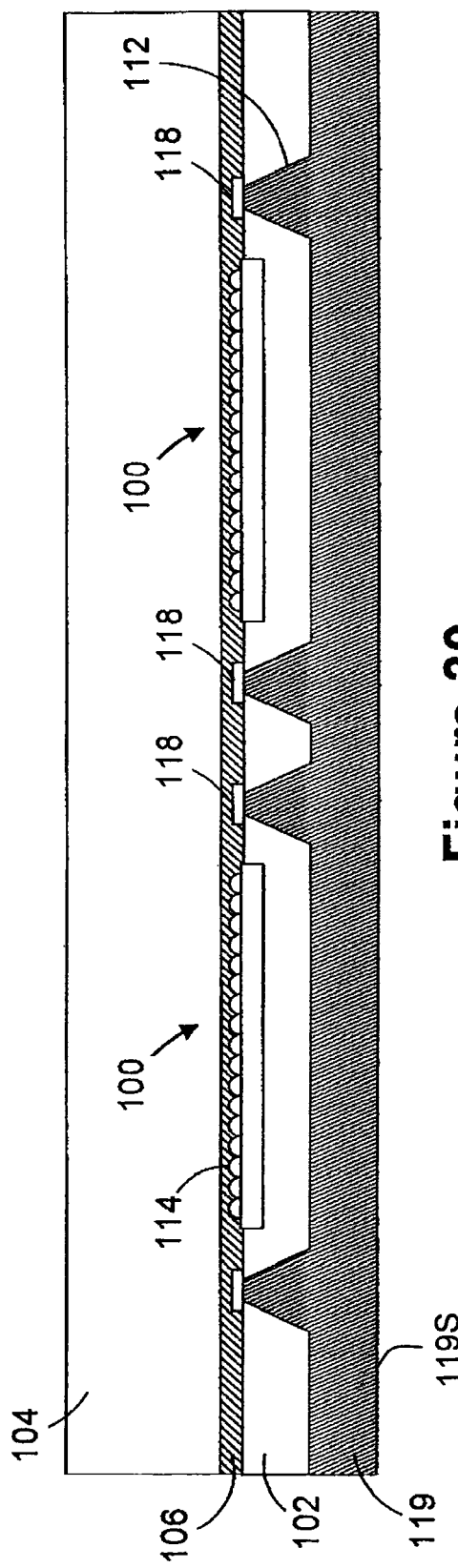
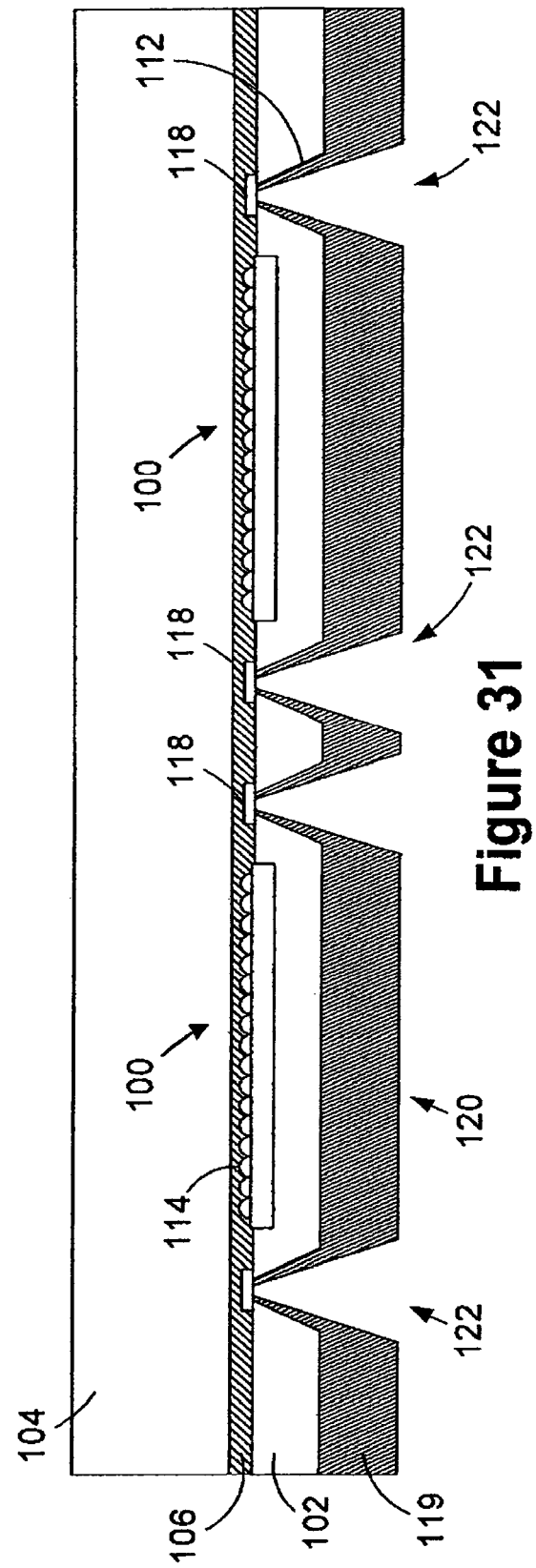

PACKAGING METHODS FOR IMAGER DEVICES

BACKGROUND OF THE INVENTION

1. Technical Field

The present subject matter is generally directed to the field of microelectronic imager devices and various methods of packaging and manufacturing such devices, and the resulting packaged imager devices.

2. Description of the Related Art

Microelectronic imagers are used in digital cameras, wireless devices with picture capabilities, and in many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because of their relative lower production costs, higher yields and smaller sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer 20 attached to the die 10 and a housing 30 attached to the interposer 20. The housing 30 surrounds the periphery of the die 10 and has an opening 32. The imager 1 also includes a transparent cover 40 over the die 10.

The die 10 includes an array of image sensors 12 and a plurality of bond pads 14 that are electrically coupled to the array of image sensors 12. The interposer 20 is typically a dielectric fixture having a plurality of bond pads 22, a plurality of ball pads 24 and wiring 26 that electrically couples the bond pads 22 to corresponding ball pads 24. The ball pads 24 are arranged in an array for surface mounting the imager 1 to a printed circuit board or module of another device. The bond pads 14 on the die 10 are electrically coupled to the bond pads 22 on the interposer 20 by wire bonds 28 to provide electrical pathways between the bond pads 14 and the ball pads 24. The interposer 20 can also be a lead frame or ceramic housing.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes one or more lenses 70 carried by the barrel 60. By rotating the barrel 60, the lens 70 may be properly positioned relative to image sensors 12. Thereafter, the barrel 60 is secured to the housing 30 by, for example, the use of an adhesive.

Manufacturers of imager devices are under constant pressure to reduce costs and improve manufacturing efficiencies and quality to remain competitive in the marketplace. The support 50 and barrel 60 are typically assembled separately for each die 10 individually after the die have been singulated from a wafer and attached to the interposer substrate 20. Therefore, there is a significant need to enhance the efficiency, reliability and precision of packaging microelectronic imagers.

BRIEF DESCRIPTION OF THE DRAWINGS

The invention may be understood by reference to the following description taken in conjunction with the accompanying drawings, in which like reference numerals identify like elements, and in which:

FIGS. 2-23 depict an illustrative process flow for packaging an integrated circuit device in accordance with the principles described herein;

FIGS. 26-29 depict an illustrative process flow for forming the device shown in FIGS. 24-25; and FIGS. 30-32 depict alternative techniques for forming portions of the device described herein.

Figure 1:
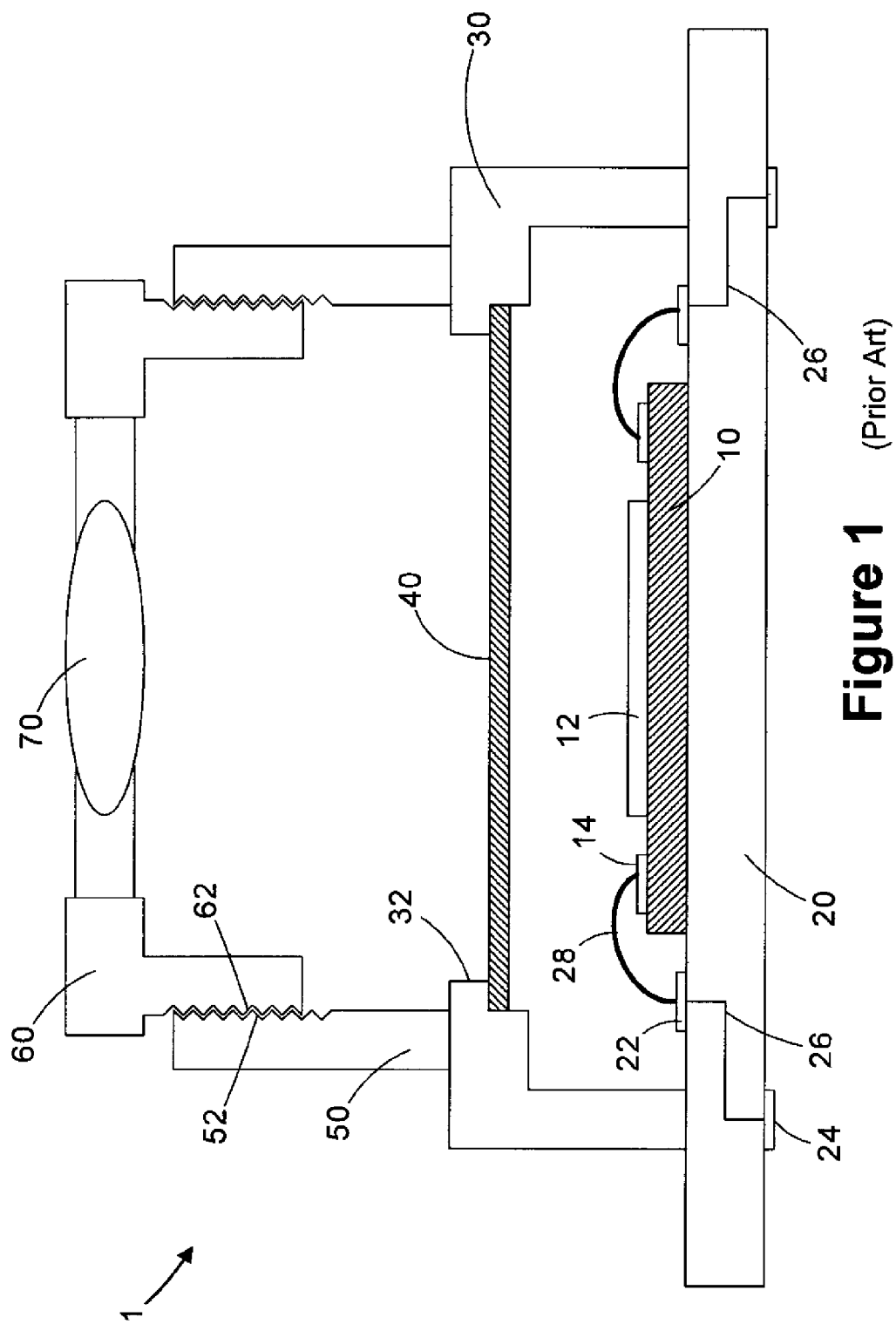
FIG. 1 is a schematic depiction of an illustrative prior art imager device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the scope of the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

In the interest of clarity, not all features of an actual implementation of the subject matter disclosed herein are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. For purposes of clarity and explanation, the relative sizes of the various features depicted in the drawings may be exaggerated or reduced as compared to the actual size of those features or structures on real-world devices. Nevertheless, the attached drawings are included to describe and explain illustrative examples of the disclosed subject matter.

FIG. 2 depicts a plurality of illustrative CMOS imager devices 100 formed on an imager substrate 102. The imager substrate 102 generally comprises a front surface 102F and a back surface 102B. A plurality of electrical contacts or bond pads 118 are formed on the front surface 102F. It should be noted that, in referring to the surface of the substrate 102 as front and back, such reference is made only in a relative sense, not an absolute sense. Moreover, when it is stated that a particular structure is formed on a front or back surface, that should be understood to be a general reference as to the location of such structure. More specifically, when a component or structure is stated to be formed on a surface, it should be understood that all or a portion of such structure may be formed or positioned on the actual surface of the substrate, in the substrate or above the surface of the substrate.

Although only two illustrative imager devices 100 are depicted in the drawings, those skilled in the art will appreciate that there may be hundreds of such imager devices 100 formed across the surface of the imager substrate 102. The imager substrate 102 may be comprised of any of a variety of materials, e.g., silicon, silicon germanium, an SOI structure, etc. The imager devices 100 may be formed in accordance with processing techniques that are well known to those skilled in the art. The imager devices 100 typically comprise an array of photosensitive elements 114 and electrical contacts or bond pads 118. The bond pads 118 are adapted to be electrically coupled to another structure or device. The photosensitive elements 114 are also typically provided with a cured polymer type lens (not shown) positioned immediately above the photosensitive elements 114.

In FIG. 3, a carrier substrate 104 is coupled to the imager substrate 102 using an adhesive material 106. The carrier substrate also has a front surface 104F and a back surface 104B. The adhesive material 106 may be any type of material that can sufficiently couple the carrier substrate 104 to the imager substrate 102 for the purposes described herein. For example, the adhesive material 106 may be a thermal or UV release type adhesive that may be applied using traditional techniques. The carrier substrate 104 may be comprised of any material having sufficient rigidity to perform the functions described herein. For example, the carrier substrates 104 may be comprised of silicon, glass, etc. In one illustrative example, the carrier substrate may have a thickness ranging from 300-700 μm. The shape or configuration of the carrier substrate 104 and the imager substrate 102 may also vary depending upon the particular application, e.g., they both may have a generally circular configuration. The thickness 105 of the carrier substrate 104 may also vary depending upon the particular application, e.g., 300-700 μm. Thus, the particular illustrative examples disclosed herein should not be considered a limitation of the present invention.

As shown in FIG. 4, the thickness of the imager substrate 102 is reduced using traditional techniques, e.g., a grinding wheel. The final thickness 103 of the imager substrate 102 may vary depending upon the particular application. In one illustrative example, the reduced thickness 103 may be approximately 25-200 μm. Next, as shown in FIG. 5, a patterned masking layer 108 is formed on the reduced thickness imager substrate 102. The patterned masking layer 108 may be comprised of a variety of materials, e.g., photoresist, a hard mask material, and it may be formed using a variety of known techniques. In one illustrative embodiment, the patterned masking layer 108 may be a patterned layer of photoresist material that is formed using traditional photolithographic tools and techniques.

As shown in FIG. 6, an etching process is performed to define a plurality of openings 110 in the back surface 102B of the imager substrate 102. The openings 110 expose at least a portion of the back surface 118B of the electrical contact or bond pads 118 of the imager devices 100. In one example, the etching process is a wet etching process that results in the openings 110 having tapered sidewalls 112. In one particularly illustrative example, the sidewalls 112 of the openings 110 are formed at an angle 116 of approximately 55 degrees. Of course, a variety of known etching processes, wet or dry, may be performed to form the openings 110. Thereafter, as shown in FIG. 7, the patterned masking layer 108 may be removed by performing various known processes depending upon the material of the patterned masking layer 108, e.g., a photoresist ashing process, a dilute acid stripping process, etc.

As shown in FIG. 8, a laminated conductive film 120 is applied to the back surface 102B of the thinned imager substrate 102. The laminated conductive film 120 comprises an underlying insulating material 120A, such as a resin, a polymer or an adhesive, and a conductive film portion 120B. The insulating material 120A has a surface 120S that is spaced apart from and approximately parallel to the back surface 102B of the imager substrate 102. In one illustrative example, the conductive film portion 120B may be a layer of copper having a thickness of 2-5 μ.m. Other conductive materials may be employed if desired. The insulating material 120A may have a thickness of approximately 70-150 μ.m. and it may be a resin, a polymer, an adhesive, or other similar materials. The laminated conductive film 120 may be applied using traditional vacuum laminated processing techniques that are well known to those skilled in the art. In one particularly illustrative example, the insulating material 120A may be comprised of bismalemide triazine (BT), FR4, FR5 available from Mitsubishi Gas & Chemical in Japan, or other similar materials. In one particularly illustrative example, the laminated conductive film 120 may be a resin material sold under the trade name SUMILITE.™ by Sumitomo of Japan.

Next, as shown in FIG. 9, a patterned masking layer 121 is formed and the conductive film 120B is patterned using a traditional wet etching technique so as to expose the underlying insulating material 120A for further processing. After the conductive film 120B is etched, a plurality of openings 122 are formed in the insulating material 120A so as to expose at least a potion of the back surface 118B of the bond pads 118 of the imager devices 100 so that conductive contact to the bond pads 118 may be established. Note that portions of the insulating material 120A remain within the openings 110 after the openings 122 are formed. In one example, the openings 122 in the insulating material 120A may be formed using traditional laser drilling techniques. Thereafter, the masking layer 121 may be removed. Then, as shown in FIG. 10, a conductive structure 123 is formed in the opening 122 to establish conductive coupling to the bond pad 118. In one illustrative example, the openings 122 are filled with a conductive paste 124 to define at least a portion of the conductive structure 123. The conductive paste 124 may be comprised of a variety of conductive materials, e.g., copper.

As shown in FIG. 11, in one illustrative embodiment, a conductive cap layer 126 may then be formed. The conductive cap layer 126 may be comprised of a variety of conductive materials depending on the particular application, and it may have a thickness that ranges from approximately 5-15 μm. In one illustrative example, the conductive cap layer 126 is comprised of copper and it may be formed by one or more electroless copper deposition process that are well known to those skilled in the art. Then, as shown in FIG. 12, a patterned masking layer 128 is formed. The patterned masking layer 128 may be comprised of a variety of materials, e.g., photoresist, and it may be formed using a variety of known techniques.

As shown in FIG. 13, an etching process is performed to pattern the conductive cap layer 126 using the patterned mask layer 128 as a mask. During this process, the portions of the conductive film 120B underlying the exposed portions of the conductive cap 126 are also removed. The etching process is performed to effectively define various electrical lines or traces (sometimes referred to as a redistribution layer) in the conductive cap layer 126. Thereafter, as shown in FIG. 14, the masking layer 128 is removed using traditional techniques, e.g., a dilute acid bath.

Next, as shown in FIG. 15, a patterned layer of insulating material 130 is formed. The patterned layer of insulating material 130 may be formed by a variety of known techniques. For example, the patterned layer of insulating material 130 may be formed by initially blanket-depositing or spin-coating a layer of insulating material, and thereafter etching the layer of insulating material using traditional etching and photolithographic techniques. For example, a patterned masking layer comprised of photoresist (not shown) may be formed on the originally formed layer of insulating material prior to performing an etching process to define the patterned layer of insulating material 130 shown in FIG. 15. The patterned layer of insulating material 130 may be comprised of a variety of materials, e.g., polyimide, benzocyclobutene (BCB), etc., and it may have a thickness of approximately 2-10 μm.

Figure 16:
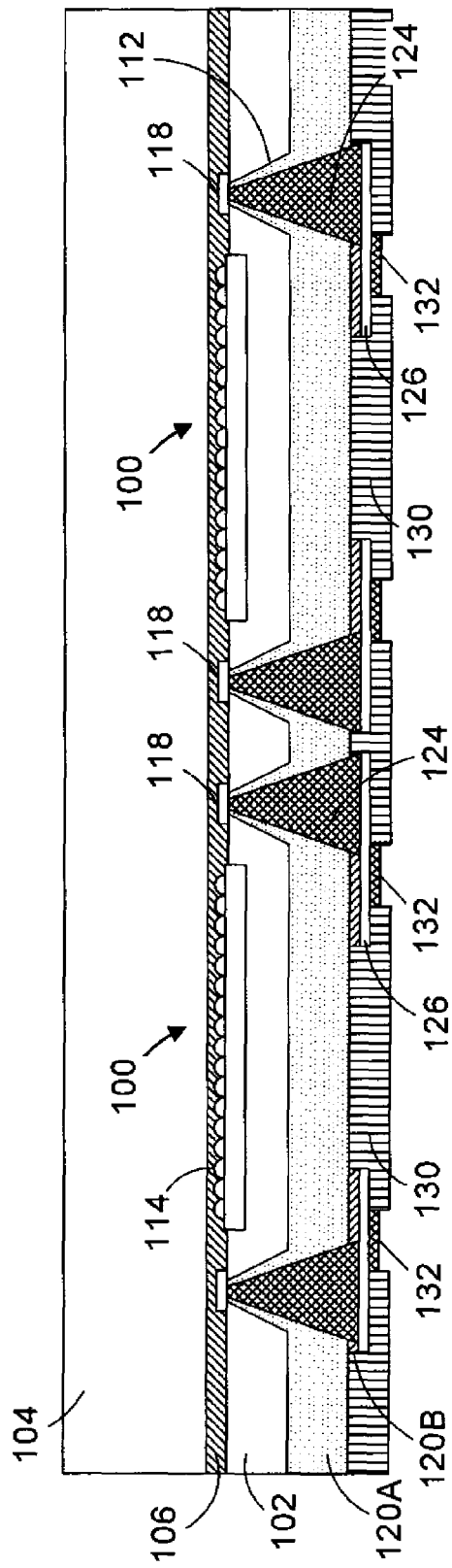

Then, as shown in FIG. 16, a process is performed to form conductive material 132 in the openings defined by the patterned layer of insulating material 130. In one particularly illustrative example, an electroless plating process is performed to form the conductive material 132. A planarization process, e.g., a CMP process, may be performed if desired or needed. The composition of the conductive material 132 and its thickness may vary depending upon the particular application. In one particular example, the conductive material 132 may be comprised of nickel, nickel-palladium-gold, nickel-gold, etc.

Figure 17:
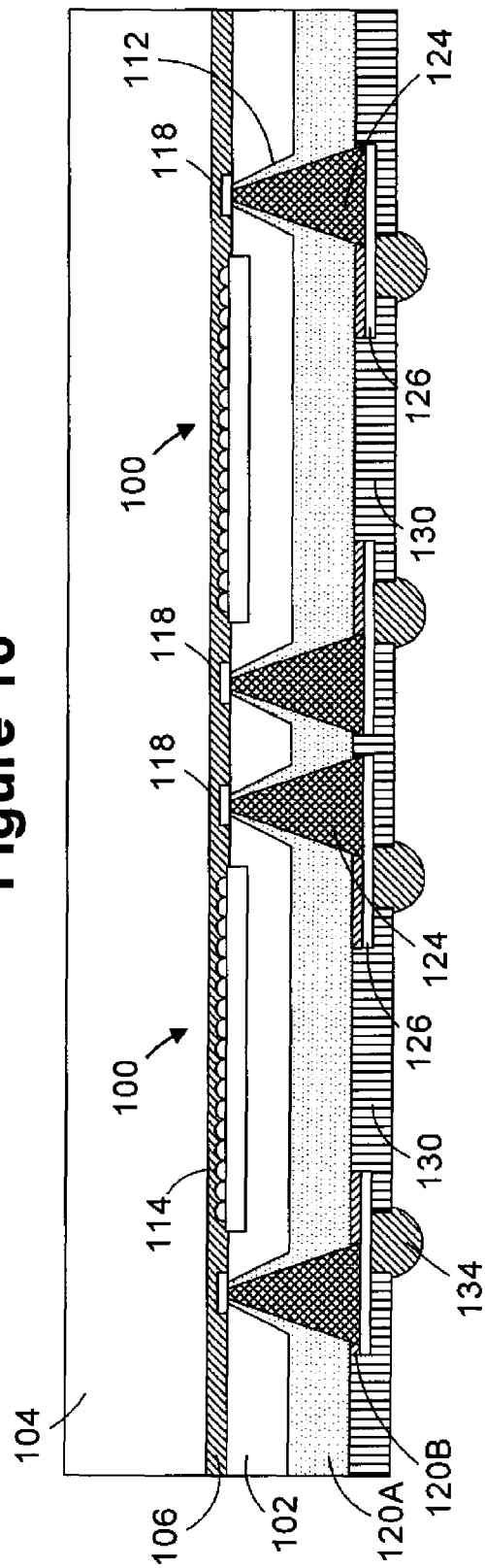
Figure 18:
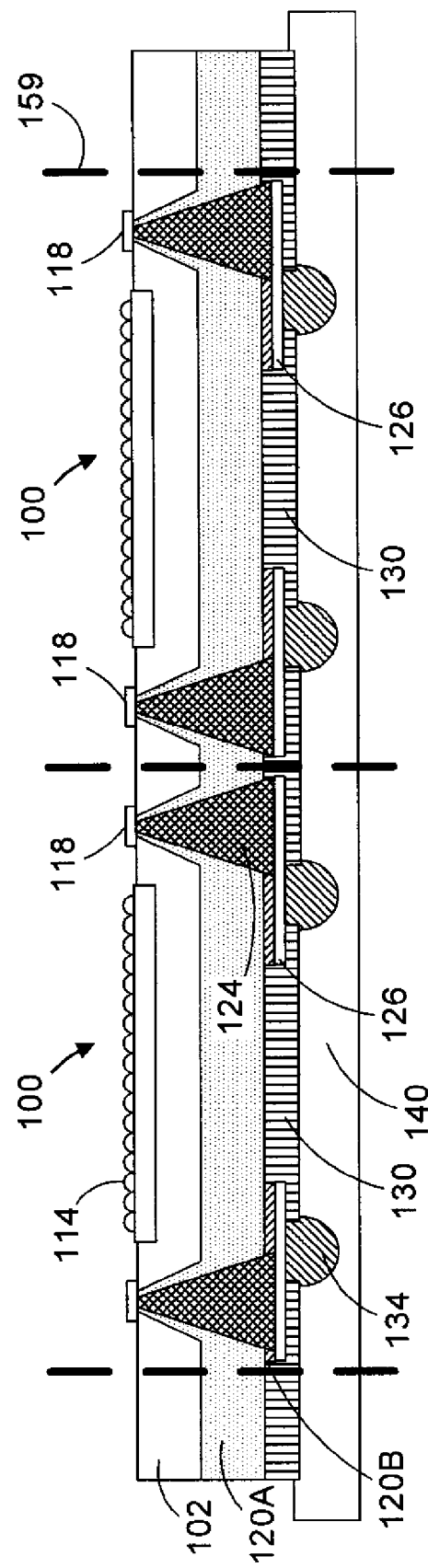

Next, as shown in FIG. 17, a plurality of conductive bumps 134, e.g., solder balls, are formed using traditional techniques. In FIG. 18, the carrier substrate 104 is removed, and the imager substrate 102 is mounted to another structure 140, i.e., a film frame or interposer. It should be understood that the structure 140 is illustrative in nature as the imager substrate 102 depicted in FIG. 17 may be coupled to any of a variety of known packaging components. If desired, the imager devices may be singulated along cut lines 159 and subjected to further processing.

The carrier substrate 104 may be removed by heating the device until such time as the adhesive nature of the adhesive material 106 is reduced, thereby permitting the carrier substrate 104 to be removed. The residual adhesive matter on the surface of the imager substrate 102 may be removed by performing a solvent rinse process.

Figure 19:
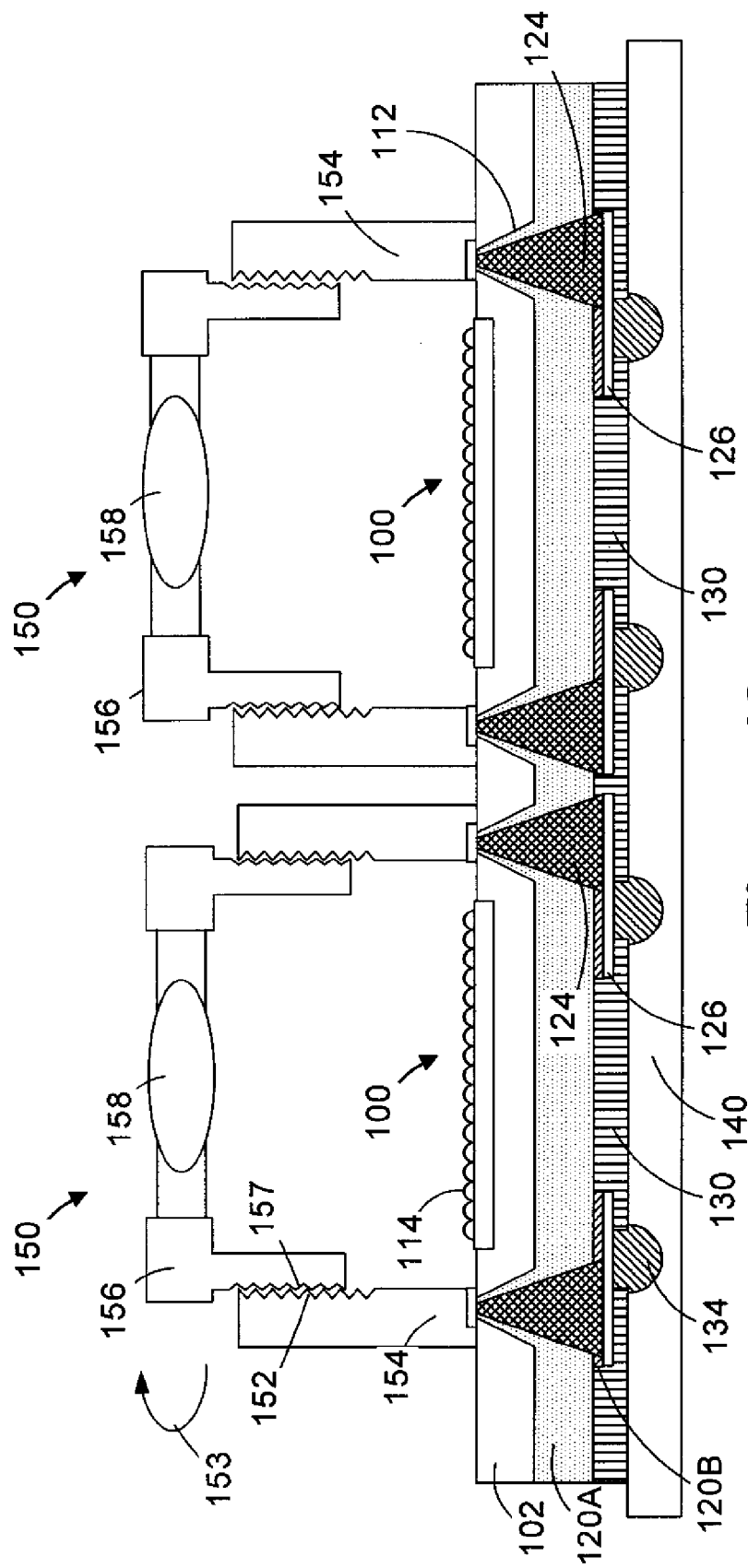

As is well known in the art, ultimately one or more lenses may be positioned above the imager devices 100 so as to properly focus light onto the imager devices 100. In one illustrative technique described herein, as shown in FIG. 19, a plurality of schematically depicted discrete lens modules 150 are mounted above the imager substrate 102. In some cases, the lens modules 150 may only be positioned above previously identified known-good-die. The modules 150 may be mounted to the imager substrate 102 using an adhesive material. The modules 150 may be prefabricated modules that are adapted to be mounted above the imager devices 100. The exact structure of the illustrative lens modules 150 depicted in the drawings should not be considered a limitation of the present invention as the exact construction details of such lens modules 150 may vary depending upon the particular application. The illustrative lens module 150 depicted in FIG. 19 includes a support structure 154 and a housing 156 that may be adjustably coupled to the support structure 154. In one example, the support structure 154 may include internal threads 152 and the housing 156 may include external threads 157 that are adapted to engage the internal threads 152. The lens module 150 may also comprise one or more schematically depicted optical lens 158. The lens modules 150 may also only be mounted above known-good-die as opposed to mounting the modules 150 above all die formed above the substrate. In the example depicted herein, the structures 154 are depicted as covering the bond pad above the top surface of the imager substrate 102. However, as will be recognized by those skilled in the art, the structures 154 may be positioned at any desired location, i.e., the structures 154 may or may not cover all or a portion of the bond pads or the top surface of the imager substrate 102.

Figure 20:
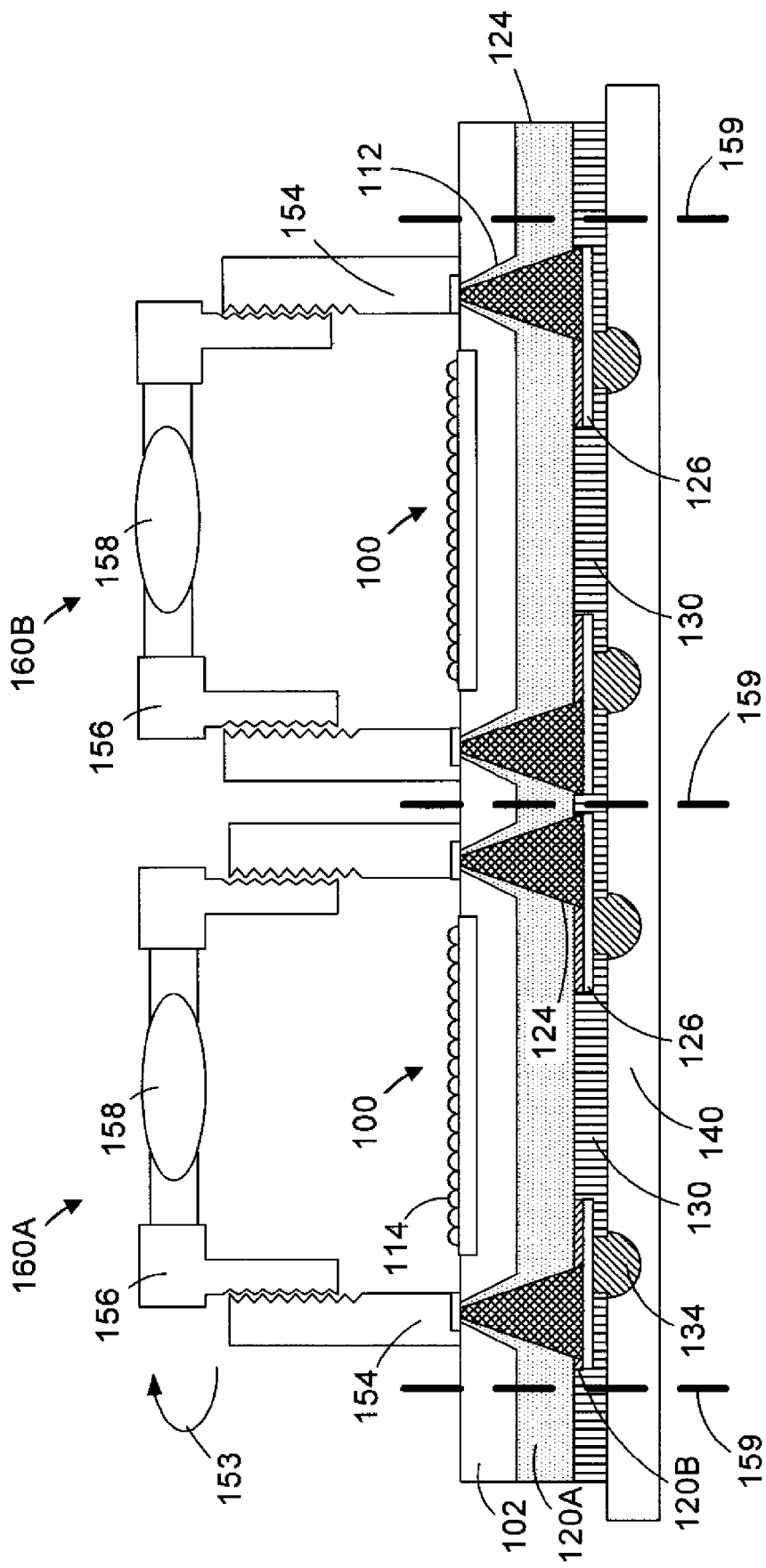

Thereafter, as shown in FIG. 20, traditional dicing processes may be performed to singulate the structure along cut lines 159 and thereby define separate components 160a, 160b, each of which comprises an imager device 100 and a lens module 150. The singulated components 160a, 160b may then be subjected to further processing, e.g., focus adjustment, etc. For example, the housing or barrel 156 may be rotated, as indicated by the arrow 153, to adjust the focal position of the lens 158 relative to the photosensitive elements 114. After the lens 158 is properly positioned, the housing 156 may be secured to the support structure 154 by a variety of techniques, e.g., an adhesive material.

Figure 21:
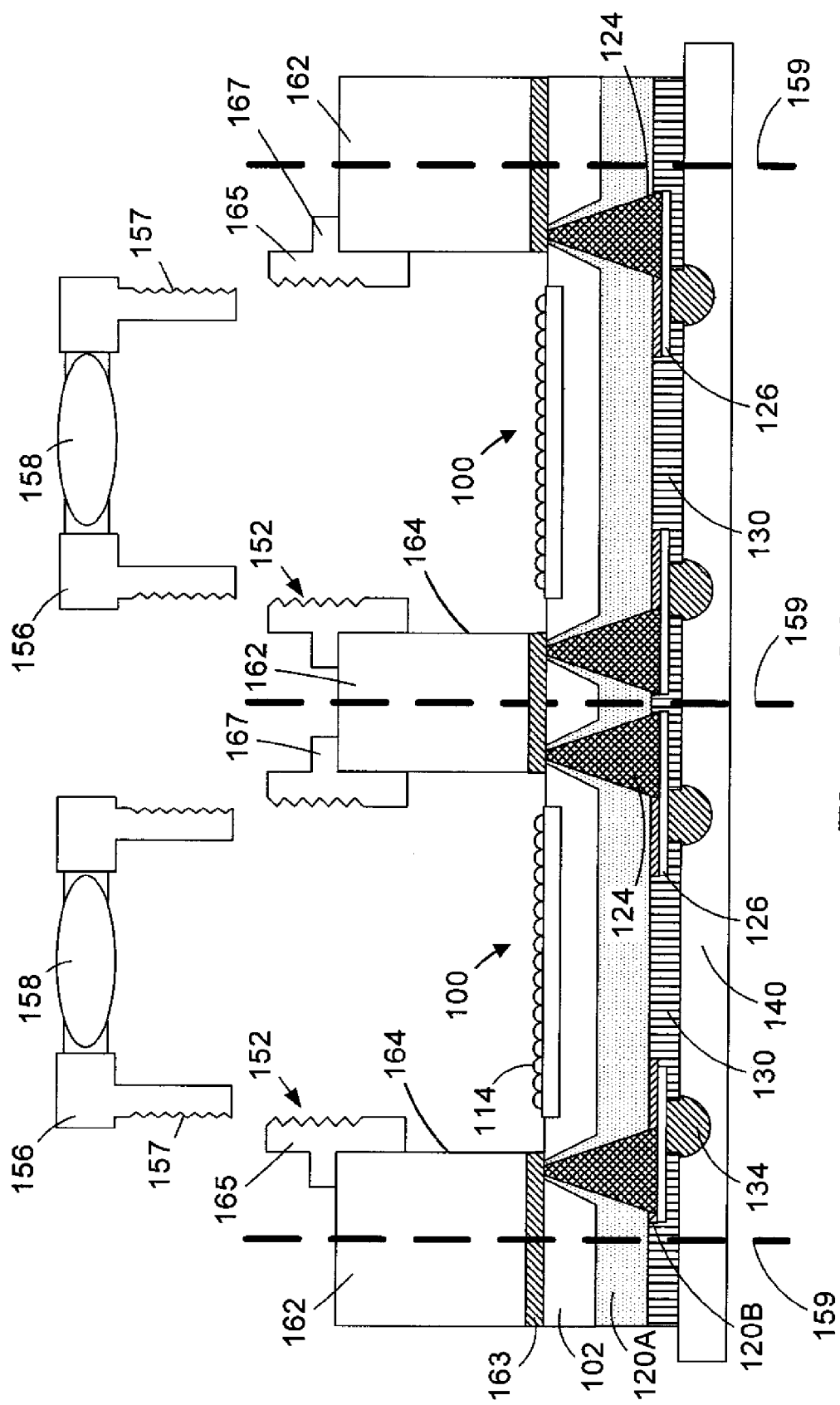
Figure 22:
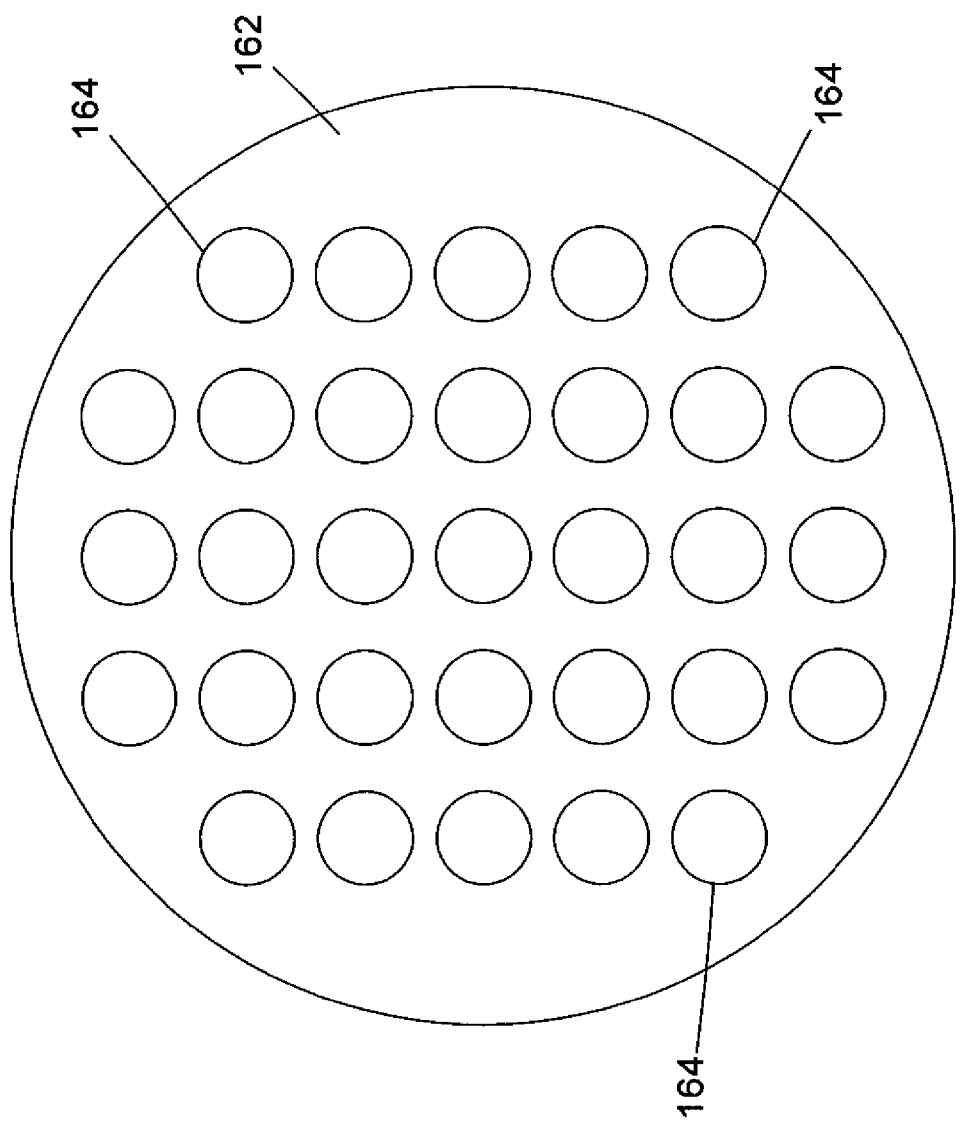

FIGS. 21 and 22 depict an alternative arrangement whereby a lens mounting substrate 162 is positioned above the imager substrate 102. In this example, the lens mounting substrate 162 may be different from the carrier substrate 104, and it may be secured to the imager substrate 102 by an adhesive 163. The lens mounting substrate 162 is provided as a single unit and it contains a plurality of openings 164, each of which are adapted to be positioned above an individual imager device 100 on the imager substrate 102. One or more lenses 158 may be positioned above the openings 164 and the imager devices 100 using a variety of techniques. In one example, a support structure 165 having internal threads 152 may be positioned at least partially within each of the openings 164. In the depicted example, the structure 165 comprises a flange 167 that may be coupled to the lens mounting substrate 162 by an adhesive material. Other arrangements are also possible. Thereafter, the components may be separated from one another along the cut lines 159 using traditional dicing processes. After this dicing process is performed, each of the separated components is comprised of an imager device 100 and the associated lens assembly.

In some cases, the lens mounting substrate 162 may accommodate the same number of lenses as there are imager devices 100 on the imager substrate 102. For example, the lens mounting substrate 162 may comprise a plurality of openings 164, each of which are substantially aligned with the imager devices 100 on the imager substrate 102. That is, the lens mounting substrate 162 may span the entire image substrate 102 or it may be such that the lens mounting substrate 162 may be smaller in size, i.e., have less surface area, than the imager substrate 102. For example, each lens mounting substrate 162 may only cover a portion of the imager substrate 102. In that case, multiple lens mounting substrates 162 may be employed to span or cover the entirety of imager substrate 102. FIG. 22 depicts a top view of one illustrative embodiment of the lens mounting substrate 162 wherein the lens mounting substrate 162 has a generally circular configuration and is of the approximate same size as the imager substrate 102. As indicated above, the openings 164 in the lens mounting substrate 162 are configured and positioned such that they substantially align with the underlying imager devices 100 formed on the imager substrate 102. Of course, the number of openings 164 depicted in FIG. 22 is illustrative in nature, as hundreds of such openings may be formed in a real-world lens mounting substrate 162.

Figure 23:
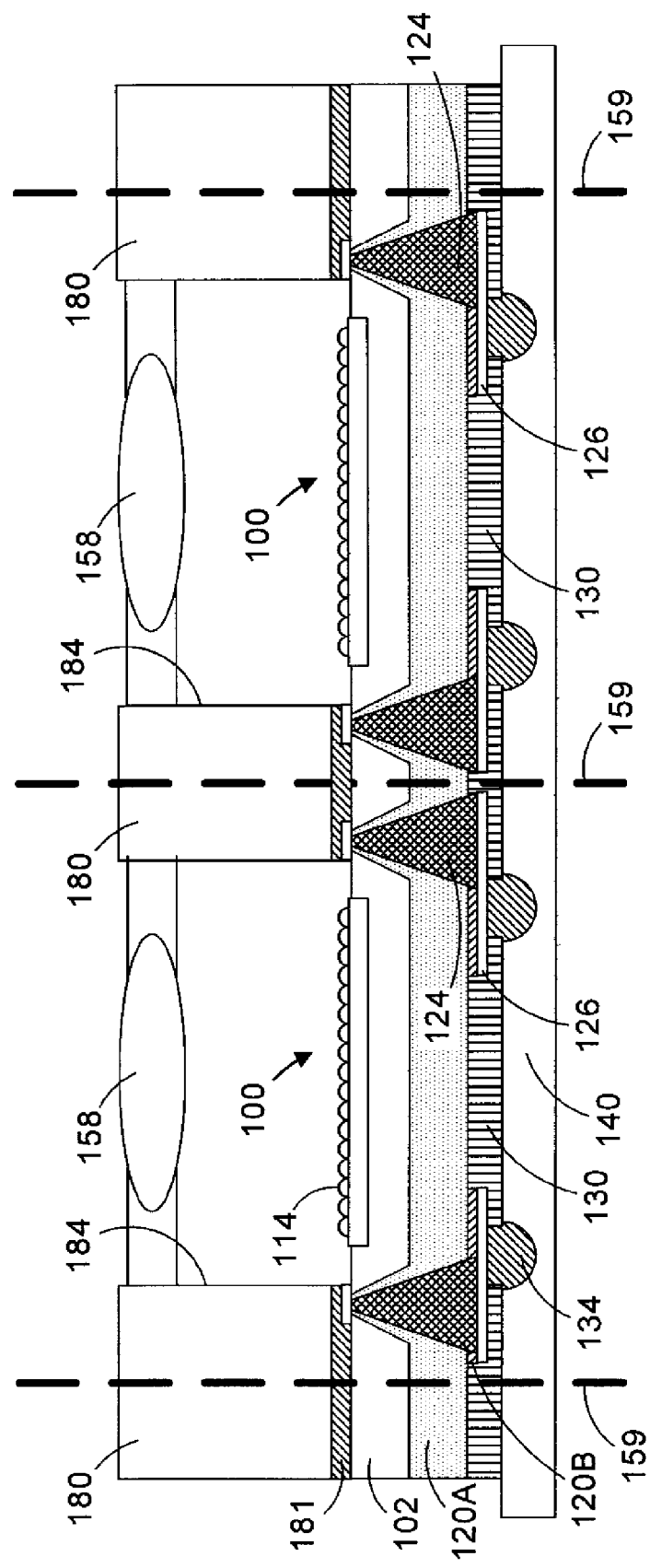
Figure 24:
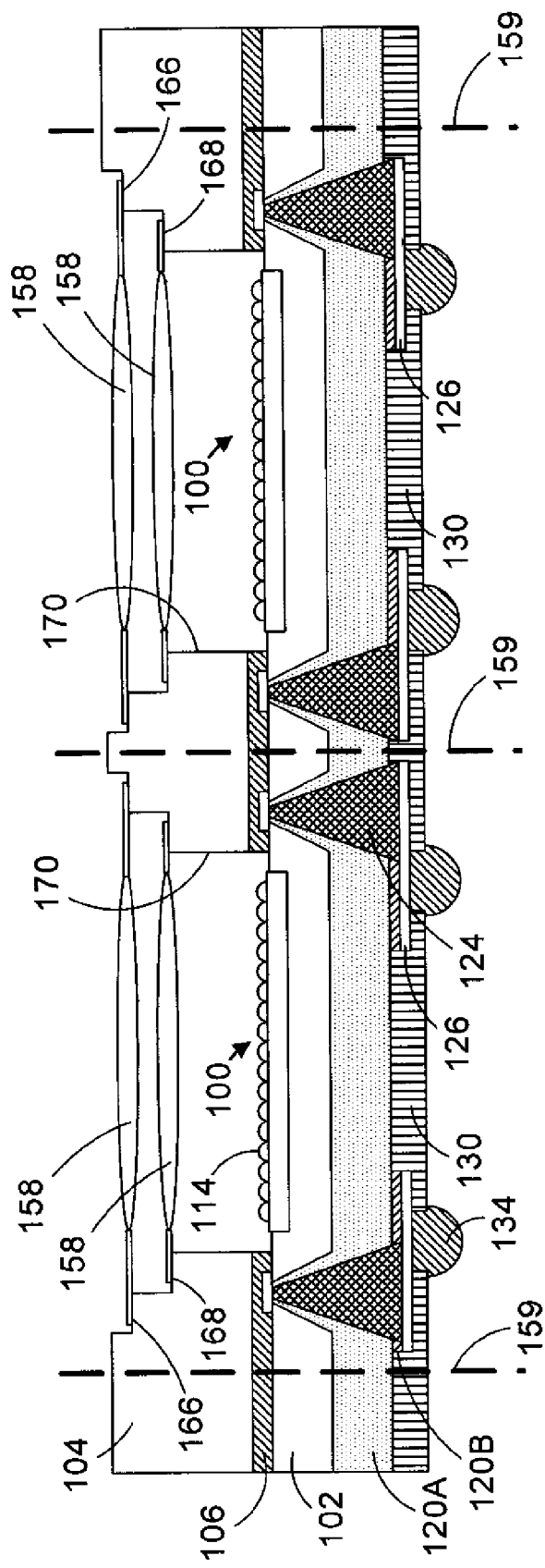
FIGS. 24-25 depict a side view and plan view, respectively, of an illustrative example wherein one or more lens may be positioned in a carrier substrate as described herein.

FIG. 23 depicts an illustrative embodiment wherein a lens containing substrate 180 is positioned above the imager substrate 102. In some case, the lens containing substrate 180 may be different from the carrier substrate 104, and it may be attached to the imager substrate 102 by an adhesive layer 181. The lens containing substrate 180 comprises a plurality of openings 184, each of which comprises at least one lens 158. The lens 158 may be integrally mounted in the substrate 180. The openings 184 are adapted to be substantially aligned with an underlying imager device 100 formed on the imager substrate 102. As with the lens mounting substrate 162 discussed above, the size and number of openings 184 that are formed in the lens containing substrate 180 may vary depending upon the particular application. That is, the lens containing substrate 180 may, in one example, have a number of openings 184 that correspond to the number of imager devices 100 formed on the imager substrate 102. In other applications, the lens containing substrate 180 may have fewer openings 184 and multiple lens containing substrates 180 may be employed to fully cover all of the imager devices 100 formed on the imager substrate 102. As mentioned above, the openings 164 contain one or more schematically depicted lens 158 to properly direct light onto the underlying imager device 100. The focal adjustment of such lenses 158 may be controlled by properly sizing and positioning the mechanical dimensions of the substrate 180 and the openings 184. As before, the various components will ultimately be singulated along cut lines 159.

Figure 25:
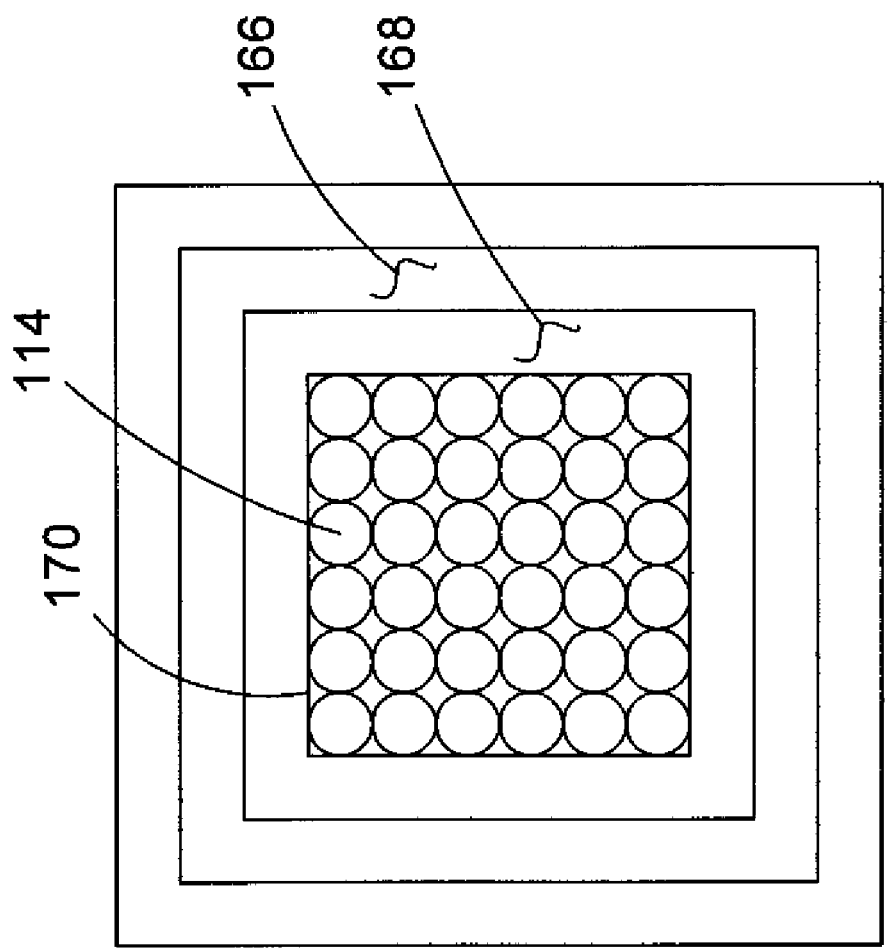

FIGS. 24-29 depict another embodiment disclosed herein. FIG. 25 is a plan view of one illustrative embodiment of the structure depicted in FIG. 24. In general, the carrier substrate 104 (or another substrate) may be formed so as to define one or more surfaces that are adapted to assist in the positioning or mounting of one or more lenses 158 above the imager devices 100. In the illustrative example depicted in FIGS. 24 and 25, the carrier substrate 104 may be patterned so as to define a plurality of lens mounting surfaces 166, 168 and a plurality of openings 170. The openings 170 are substantially aligned with the underlying imager devices 100. The lens mounting surfaces 166, 168 are adapted to receive one or more optical lenses 158. The lenses 158 may be secured to the lens mounting surfaces 166, 168 by a variety of known techniques, e.g., through use of an adhesive. Although two illustrative lens mounting surfaces 166, 168 are depicted in the drawings, the present invention should not be considered as limited to that illustrative example. One or more lenses 158 may be positioned in each of the openings 170 in the carrier substrate 104 (or another substrate) using the techniques described herein.

The openings 170 are defined in the substrate 104 so that light may irradiate the photosensitive elements 114 on the imager device 100 through the lenses 158. The number of lenses desired may dictate the number of lens support surfaces formed in the substrate 107. The shape of the opening 170, as well as the lens support surfaces 166, 168, e.g., square, round, rectangular, may also vary. In the case where the carrier substrate 104 may be made of an opaque or less than transparent material, the carrier substrate 104 may tend to block light from being directed toward the imager device 100 from the side. The rigidity provided by the carrier substrate 104 may also help support the relatively thin imager substrate 102.

Figure 26:
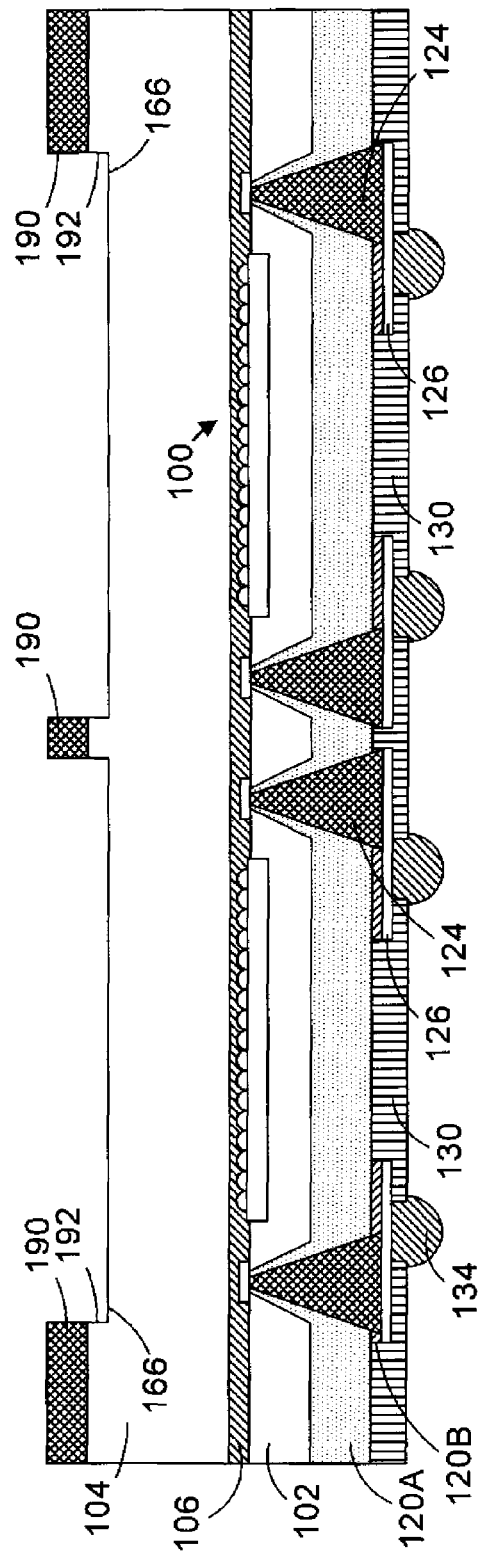

FIGS. 26-29 depict an illustrative process flow for forming the lens mounting surfaces 166, 168 and the openings 170 in the substrate 104. The lens mounting surfaces 166, 168 may be defined by performing traditional wet or dry etching techniques using any of a variety of known wet or dry etching processes and various masking layers that may be formed by traditional photolithographic techniques. In FIG. 26, a patterned masking layer 190, e.g., photoresist, is formed above the substrate 104. A wet or dry etching process may be performed to define a recess 192 that extends partially into the substrate 104. A portion of the bottom surface of the recess 192 will serve as the lens mounting surface 166. Thereafter, the patterned masking layer 190 may be removed using traditional techniques.

Figure 27:
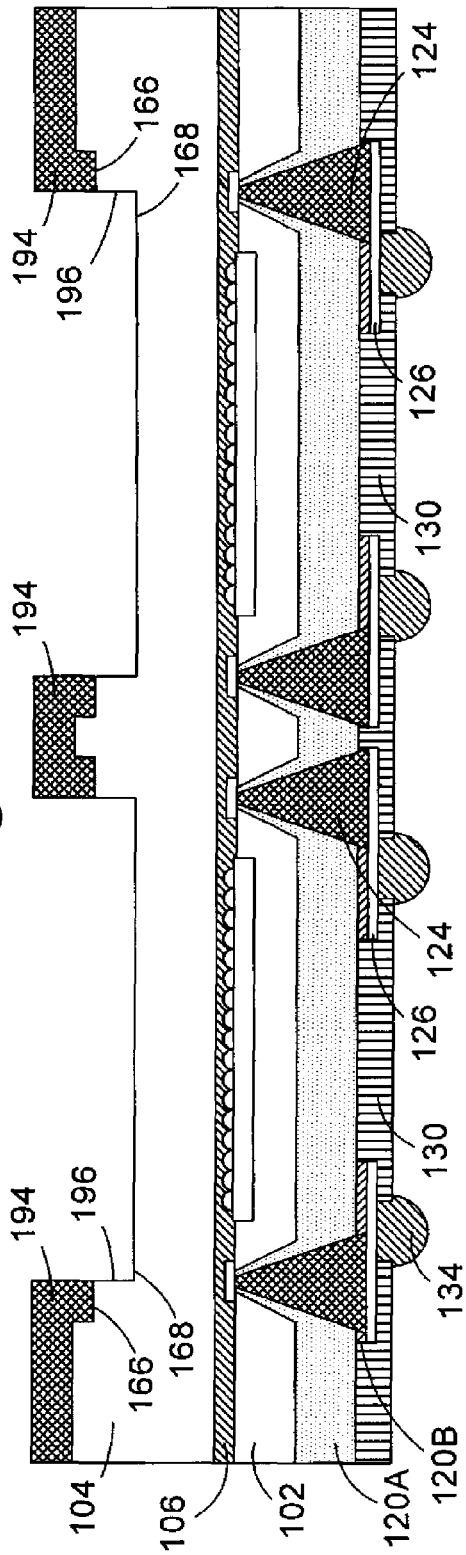

As shown in FIG. 27, a patterned masking layer 194, e.g., photoresist, is formed using traditional photolithographic techniques. A wet or dry etching process is then performed to define a recess 196 that also extends partially into the substrate 104. A portion of the bottom surface of the recess 196 will serve as the lens mounting surface 168. Thereafter, the patterned masking layer 194 may be removed.

In FIG. 28, a patterned masking layer 198, e.g., photoresist, is formed. A wet or dry etching process is then performed to define the openings 170. The adhesive material 106 may be used to protect the underlying imager devices 100 during this etching process. Alternatively, the etching process performed to form the openings 170 may completely or at least partially remove the adhesive material 106 within the openings 170. In FIG. 28, the adhesive material 106 above the imager devices 100 is depicted as remaining in position after the etching of the openings 170 is performed.

Next, as shown in FIG. 29, a solvent rinse process is performed to remove the adhesive material 106 within the openings 170. During this process, the cured polymer lens (not shown) above the photosensitive elements 114 protects such elements.

As indicated in FIG. 8, in one example, a resin-coated conductive film 120 was applied to the back surface 102B of the imager substrate 102. In an alternative embodiment, as shown in FIG. 30, traditional epoxy mold compound material 119 may be applied to the imager substrate 102 and it may be in power or liquid form. In one example, mold compound material 119 may be applied to the substrate 102 using traditional molding techniques. For example, after the openings 110 are formed in the imager substrate 102 (FIG. 7), the imager substrate 102 may be positioned in a mold (not shown) and the mold material 119 may be injected therein. Thereafter, the mold material 119 may be allowed to cure. The mold material 119 has a surface 119S that may be spaced apart from and substantially parallel to the back surface 102B of the imager substrate 102.

Figure 32:
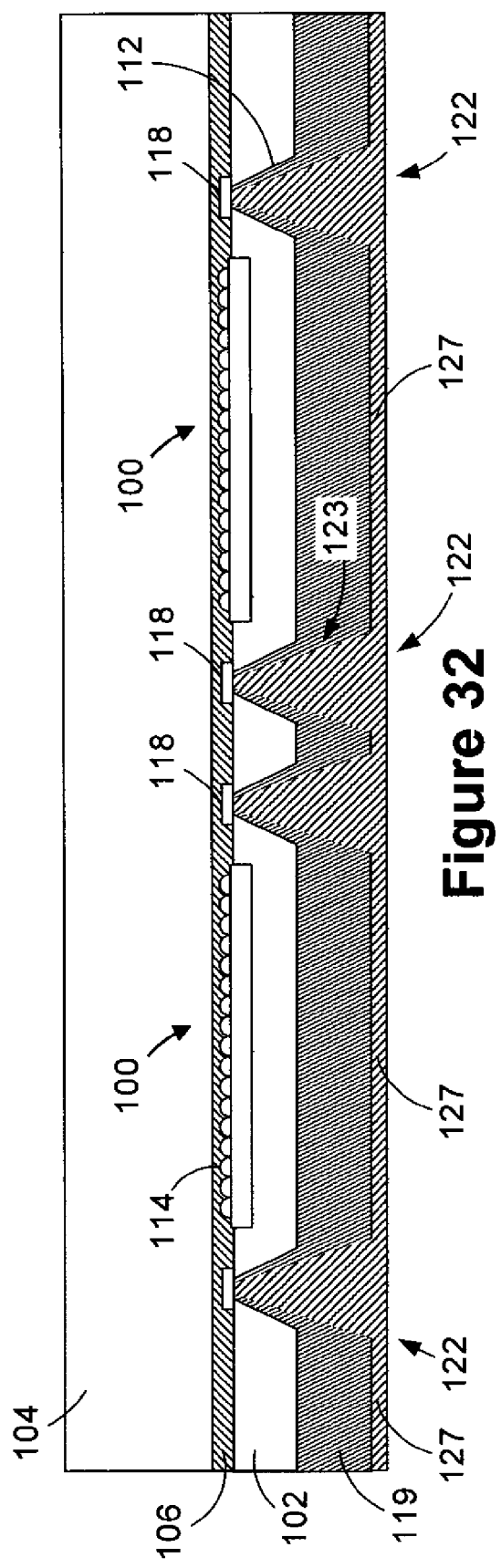

The openings 122 may then be formed in the mold compound material 119 as shown in FIG. 31 by performing a laser drilling process. Next, as shown in FIG. 32, the conductive structure 123 may be formed in the openings 122. In one example, a conductive material 127 may be formed in the openings 122. The conductive material 127 may be comprised of a variety of materials, e.g., copper, and it may be formed using a variety of known techniques. In one particular example, the conductive material 127 may be formed by an electroless deposition process to form a seed layer and, thereafter, an electroplating process is performed to overfill the openings 122. If desired, a planarized process, e.g., CMP, may then be performed to remove excess conductive material. Thereafter, processing of the device may continue with the steps beginning in FIG. 12.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an imager device, comprising:
   forming a first opening in a back surface of an imager substrate comprising at least one photosensitive element and at least one electrical contact on a front surface of the imager substrate, the first opening permitting conductive coupling to a portion of a back surface of the electrical contact;
   forming a laminated conductive film on the back surface of the imager substrate, the laminated conductive film comprising an insulating material and a conductive film portion, wherein a portion of the insulating material is formed within the first opening, wherein at least a portion of the insulating material is interposed between the conductive film portion and the imager substrate;
   after forming the laminated conductive film, forming a second opening through the laminated conductive film and within the first opening, the second opening permitting conductive coupling to a portion of the back surface of the electrical contact, wherein, after the formation of the second opening, a portion of the insulating material remains within the first opening; and
   forming a conductive structure within the second opening, wherein the insulating material remaining within the first opening after the formation of the second opening is positioned between at least a portion of the conductive structure and the imager substrate.

2. The method of claim 1, wherein the insulating material comprises at least one of a resin, a polymer and an adhesive.

3. The method of claim 1, wherein forming the first opening comprises forming the first opening such that the first opening comprises sloped sidewalls.

4. The method of claim 1, further comprising performing a vacuum lamination process to position the portion of the insulating material of the laminated conductive film into the first opening.

5. The method of claim 1, wherein forming the second opening comprises:
   forming an opening in the conductive layer of the laminated conductive film by performing at least one etching process, the opening exposing a portion of the insulating material; and
   forming the second opening in the insulating material by performing a laser drilling process.

6. The method of claim 1, wherein forming the conductive structure comprises positioning a conductive paste in the second opening.

7. The method of claim 1, wherein forming the conductive structure comprises performing at least one deposition process to form a conductive material within the second opening.

8. The method of claim 1, further comprising forming a conductive bump that is conductively coupled to the conductive structure.

* * * * *